United States Patent
Abraham et al.

[19]

[11] Patent Number: 5,946,228

[45] Date of Patent: Aug. 31, 1999

[54] LIMITING MAGNETIC WRITING FIELDS TO A PREFERRED PORTION OF A CHANGEABLE MAGNETIC REGION IN MAGNETIC DEVICES

[75] Inventors: David William Abraham, Ossining, N.Y.; Philip Louis Trouilloud, Mahwah, N.J.

[73] Assignee: International Business Machines Corporation, Armonk, N.Y.

[21] Appl. No.: 09/021,569

[22] Filed: Feb. 10, 1998

[51] Int. Cl.$^6$ .................................................. G11C 11/15
[52] U.S. Cl. ............................................ 365/173; 365/158
[58] Field of Search .................................... 365/171, 173, 365/158

[56] References Cited

U.S. PATENT DOCUMENTS

| | | | |
|---|---|---|---|
| 5,341,118 | 8/1994 | Parkin et al. | 338/32 R |
| 5,408,377 | 4/1995 | Gurney et al. | 360/113 |
| 5,640,343 | 6/1997 | Gallagher et al. | 365/171 |
| 5,650,958 | 7/1997 | Gallagher et al. | 365/173 |
| 5,748,519 | 5/1998 | Tehrani et al. | 365/98 |
| 5,838,608 | 11/1998 | Zhu et al. | 365/158 |

OTHER PUBLICATIONS

Fernandex, P.J., et al., "Magnetic Force Microscopy of Single–Domain Cobalt Dots Patterned Using Interference Lithography," IEEE Transactions on Magnetics, vol. 32, No. 5, (Sep. 1996), pp. 4472–4474.

Zheng, Y. & Zhu, J., "Micromagnetic Pinciples in Pseudo Spin Valve Memory Element Design," IEEE Transactions on Magnetics, vol. 33, No. 5, (Sep. 1997), pp. 3286–3288.

*Primary Examiner*—Son Mai
*Attorney, Agent, or Firm*—Heslin & Rothenberg,P.C.

[57] ABSTRACT

Magnetic devices are disclosed which include a changeable magnetic region, within which each of two magnetic states can be imposed, using an applied magnetic writing stimuli. Upon subsequent electrical tunneling through the device, for example, the relative orientation of the magnetic states of the changeable magnetic region, and a proximate, reference magnetic region, can be sensed, thereby providing a binary storage capability. The present invention limits the magnetic writing stimuli to only a preferred portion of the changeable magnetic region, e.g., the portion within which the two magnetic states can be dependably written opposite of one another. The magnetic writing stimuli is limited to a preferred portion of the changeable magnetic region by either narrowing the bitline and/or wordline structures associated with applying the magnetic stimuli, and/or by lengthening the changeable magnetic region into an elongated structure such that its elongated dimension is greater than the lateral dimension of either or both of its respective wordline and bitline. The principles of the present invention can be applied to magnetic random access ("MRAM") arrays, which employ magnetic tunnel junction ("MTJ") cells at respective intersections of bitlines and wordlines.

31 Claims, 8 Drawing Sheets

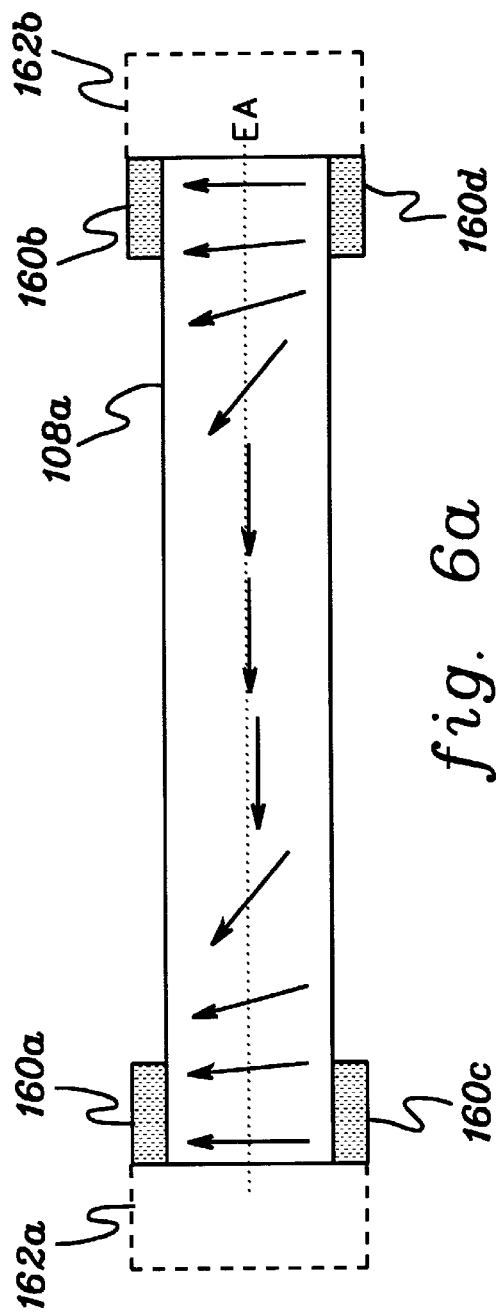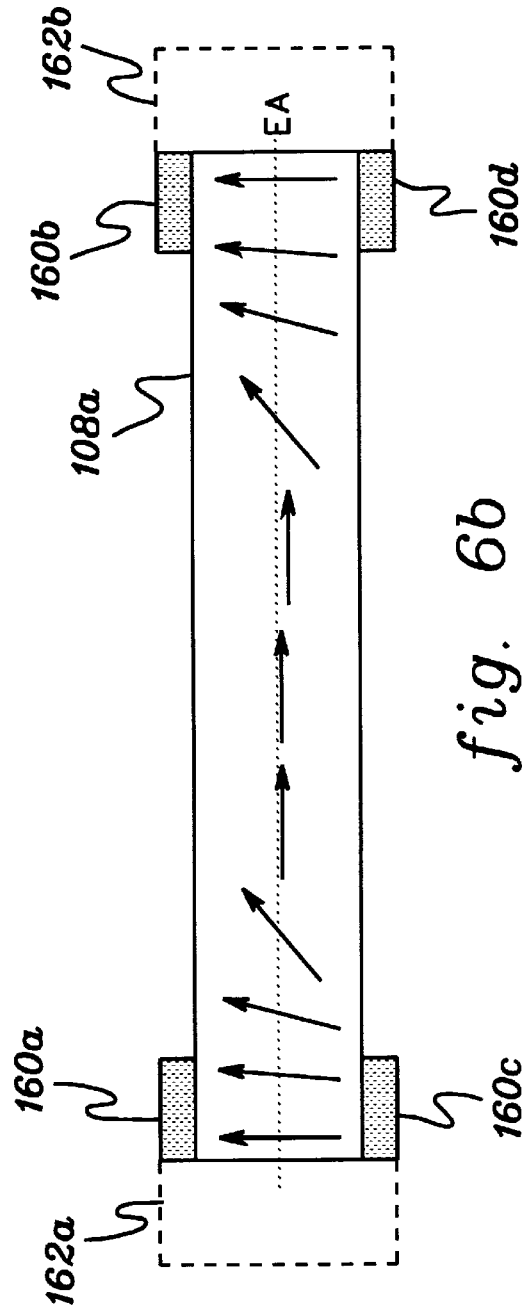

LIMITING MAGNETIC WRITING FIELDS TO A PREFERRED PORTION OF A CHANGEABLE MAGNETIC REGION IN MAGNETIC DEVICES

CROSS REFERENCE TO RELATED APPLICATIONS

This Application relates to the following commonly assigned, issued U.S. Patents:
1. U.S. Pat. No. 5,640,343, issued Jun. 17, 1997 and entitled "MAGNETIC MEMORY ARRAY USING MAGNETIC TUNNEL JUNCTION DEVICES IN THE MEMORY CELLS"; and
2. U.S. Pat. No. : 5,650,958, issued Jul. 22, 1997 and entitled "MAGNETIC TUNNEL JUNCTIONS WITH CONTROLLED MAGNETIC RESPONSE."

This Application relates to the following commonly assigned, concurrently filed U.S. patent applications:
1. Application Ser. No.: 09/021,342, filed Feb. 10, 1998 and entitled, "MAGNETIC MEMORY DEVICES HAVING MULTIPLE MAGNETIC TUNNEL JUNCTIONS THEREIN";
2. Application Ser. No.: 09/021,515, filed Feb. 10, 1998, and entitled, "INTENTIONAL ASYMMETRY IMPOSED DURING FABRICATION AND/OR ACCESS OF MAGNETIC TUNNEL JUNCTION DEVICES"; and
3. Application Ser. No.: 09/021,352, filed Feb. 10, 1998, and entitled, "LIMITING MAGNETORESISTIVE ELECTRICAL INTERACTION TO A PREFERRED PORTION OF A CHANGEABLE MAGNETIC REGION IN MAGNETIC DEVICES."

Each of these U.S. Patents and U.S. Patent Applications is hereby incorporated by reference herein in its entirety.

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This invention relates to the fabrication and access of magnetic devices used in, for example, magnetic memory cells in a magnetic random access memory ("MRAM").

BACKGROUND OF THE INVENTION

Magnetic Random Access Memory ("MRAM") arrays of the type disclosed in the two above-incorporated U.S. Patents, and depicted in FIGS. 1a–b herein, include an array of magnetic memory cells (e.g., cell 9) positioned at the intersections of wordlines 1, 2, 3 and bitlines 4, 5, 6. Each cell includes a magnetically changeable or "free" region 24, and a proximate magnetically reference region 20, arranged into a magnetic tunnel junction ("MTJ") device 8. (The term reference region is used broadly herein to denote any type of region which, in cooperation with the free or changeable region, results in a detectable state of the device as a whole.) The principle underlying storage of data in such cells is the ability to change the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetization using applied bi-directional electrical and resultant magnetic stimuli via its respective bitline and wordline, and is later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

An ideal hysteresis loop characterizing the tunnel junction resistance with respect to the applied EA field is shown in FIG. 2. The resistance of the tunnel junction can assume one of two distinct values with no applied stimulus in region 50, i.e., there is a lack of sensitivity of resistance to applied field below the easy axis flipping field strength $+/-H_c$ in region 50. If the applied easy axis field exceeds $+/-H_c$, then the cell is coerced into its respective high resistance (anti-aligned magnetization of the free region with respect to the reference region) or low resistance (aligned magnetization of the free region with respect to the reference region) state.

Even if the magnetization pattern of the two regions forming the tunnel junction is simple, reversing the direction of magnetization in the free region during writing can actually affect one or both regions in unexpected ways. For example, the reversal of the free region during writing can result in the inclusion of a magnetic vortex or complex magnetic domain walls, pinned by a defect or by edge roughness. Because the junction resistance depends on the dot product $m_{free} m_{reference}$ averaged over the junction area, inclusion of such complex micromagnetic structures in the magnetization pattern can substantially corrupt the measured tunnel junction resistance during reading.

For example, shown in FIG. 3 is the magnetization pattern in a free magnetic region 59 formed symmetrically about its easy axis EA in which a complicated wall structure is clearly evident between otherwise acceptable magnetization pattern regions. This overall magnetization pattern was attained from a nominally uniformly magnetized sample (both top and bottom layers originally pointing to the right), for which the easy axis bias was swept from +700 Oe to −700 Oe and back to +700 Oe. The reversal of magnetization evolved to a complicated structure as the field was swept from +700 Oe down to about −280 Oe. (The magnetization may not simply reverse at one critical field, but may evolve in a partially continuous and partly step-wise fashion as the net magnetization changes between the two possible opposing directions of magnetization.)

FIG. 4 is a hysteresis loop depicting the net direction of magnetization averaged over the device versus applied easy axis field for this corrupt sample. The non-square nature of region 150, resulting in a cell which will not predictably assume either one of its two states upon the removal of the easy axis applied field, is due to the evolution of such complex micromagnetic structures in the cell.

Some improvements in this situation are possible. For example, in the above-incorporated U.S. Patent Application entitled "INTENTIONAL ASYMMETRY IMPOSED DURING FABRICATION AND/OR ACCESS OF MAGNETIC MEMORY CELLS," the present inventors have disclosed a technique for avoiding the evolution of some of the undesirable micromagnetic structures in typical MRAM cells. Substantial improvements have been demonstrated, and in the best of cases no wall structures evolve during the cycling of fields used for reversing magnetization. However, for even these improved conditions, there can still be a substantial twist in the magnetization pattern.

This non-ideal behavior in the magnetization reversal process results in a reduction in the useful parametric window of operation at best, or a total collapse of the square hysteresis loop necessary for storage at worst. What is required, therefore, is an improvement in the techniques and structures for changing the free magnetic region between its magnetic states, which will minimize or eliminate the unwanted effects of complex micromagnetic structures which otherwise appear during this magnetization reversal process.

SUMMARY OF THE INVENTION

To avoid the undesirable impact of the complex micromagnetic structures potentially created during reversal of the changeable magnetic region, the present invention, in one aspect, relates to a magnetic device which includes a first magnetic region changeable into each of two magnetic states according to magnetic stimuli applied thereto. A stimuli applying structure is arranged with respect to this first magnetic region to apply the magnetic stimuli to only a preferred portion of the first magnetic region.

A plurality of first magnetic regions, including the first magnetic region, may be provided, which are changeable substantially together into each of the two magnetic states according to magnetic stimuli applied thereto. The stimuli applying structure is arranged with respect to this plurality of first magnetic regions to apply the magnetic stimuli only to respective preferred portions of the plurality of first magnetic regions. The plurality of first magnetic regions may be arranged such that magnetic patterns therein change substantially together into each of the two magnetic states upon the application of the magnetic stimuli.

Each of the plurality of first magnetic regions may be elongated, and the regions may be arranged parallel to each other.

The stimuli applying structure may comprise a first line and a crossing second line, wherein a portion of at least one of these lines has a smaller lateral dimension than the elongated dimension of the plurality of first magnetic regions. The smaller portion of this line crosses the plurality of first magnetic regions proximate the respective preferred portions thereof to apply the magnetic stimuli only to the respective preferred portions of these regions.

The magnetic device may be used in combination with a magnetic memory, wherein the magnetic device comprises a magnetic memory cell in the magnetic memory. The magnetic memory may include first and second pluralities of crossing lines, forming a plurality of intersecting regions. A plurality of magnetic memory cells, each disposed at a respective one of the intersecting regions is provided, and each cell is accessed by the respective crossing lines forming its respective intersecting region.

The lines forming the intersecting regions may cross perpendicularly, but each first magnetic region may cross through its intersecting region non-parallel to either the first or second line. If each of the first magnetic regions of the magnetic memory cells in a memory array crosses through its respective intersecting region non-parallel to either of the respective crossing lines forming its respective intersecting region, the elongated first magnetic regions may be interdigitated across the magnetic memory in a plane parallel to planes in which the first and second pluralities of crossing lines are formed, thereby improving memory density.

In the elongated embodiment of the first, changeable magnetic region, the at least two magnetic states may comprise substantially opposing directions of magnetization along a central portion of the elongated axis of the region. The two substantially opposing directions of magnetization may evolve into a common direction of magnetization at the respective ends of this region.

The region may be formed to maintain these common directions of magnetization at the respective ends thereof while allowing the first magnetic region to assume either of the two substantially opposing directions of magnetization in the central, preferred portion thereof. To facilitate this formation of the common direction of magnetization at the respective ends of the first, changeable magnetic region, fixed magnetization sources may be provided, and disposed at a respective end of the elongated first magnetic region.

Methods for writing one of two magnetic states to a magnetic device, as well as a method for fabrication of the device, discussed above, are also provided in accordance with the principles of the present invention.

By restricting the magnetic stimuli to only the preferred, central portion of an exemplary elongated changeable magnetic region, the magnetization patterns in the preferred portion will dependably and uniformly assume one of the two opposing directions of magnetization, and any potentially undesirable magnetization patterns towards the ends of the changeable region will be minimized, thereby not affecting the subsequent writing performance of the device.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

FIGS. 6a–b depict one of the elongated changeable magnetic regions of FIG. 5, and show the region assuming, respectively, each of two opposing directions of magnetization at the central, preferred portion thereof, while maintaining a common direction of magnetization at the ends thereof, and further depicts fixed magnetization bias sources at the ends of the changeable magnetic region;

DETAILED DESCRIPTION OF THE PREFERRED EMBODIMENTS

Figure 1A:
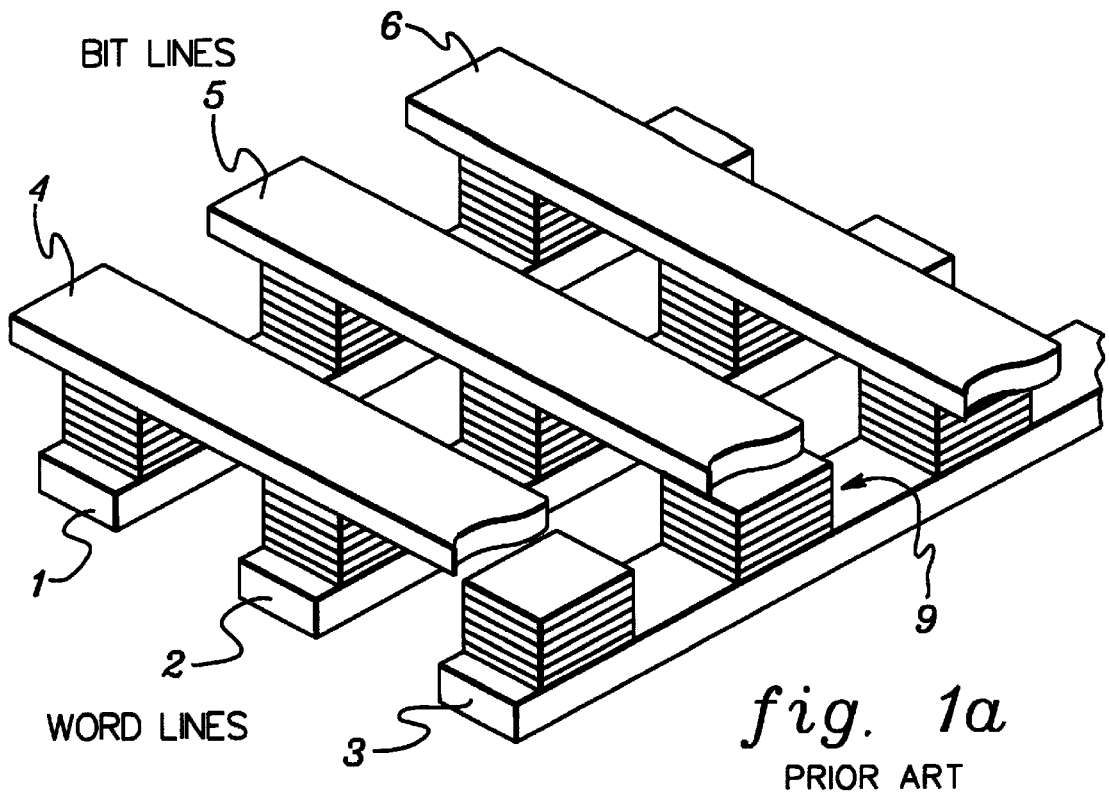
FIGS. 1a–b depict an MRAM array having a plurality of magnetic memory cells at the intersections of crossing bitlines and wordlines, and an individual magnetic tunnel junction memory cell, respectively.
Figure 1B:
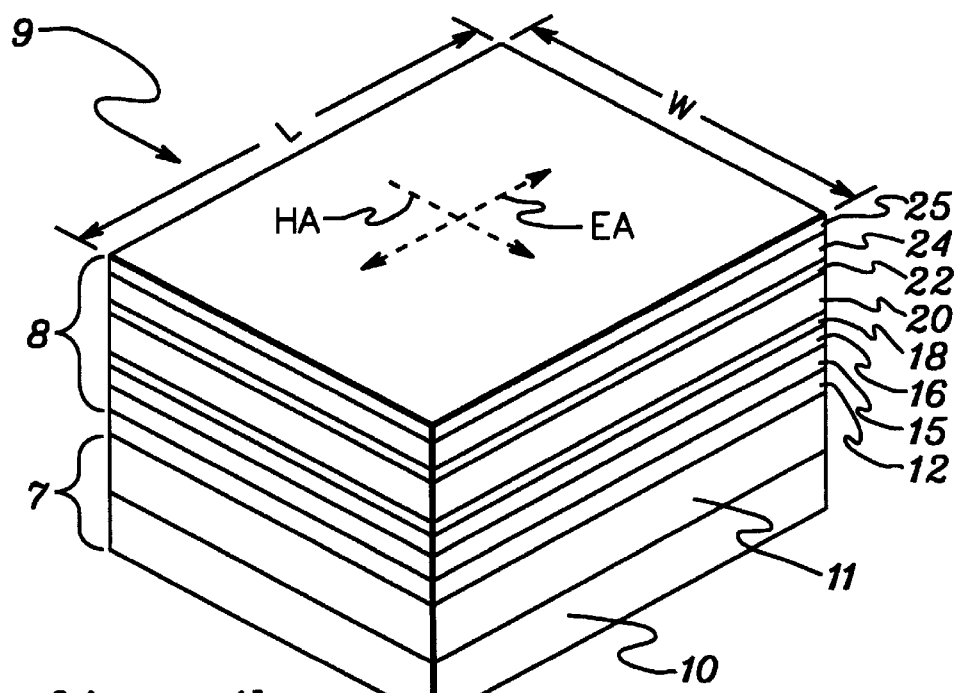
Figure 2:
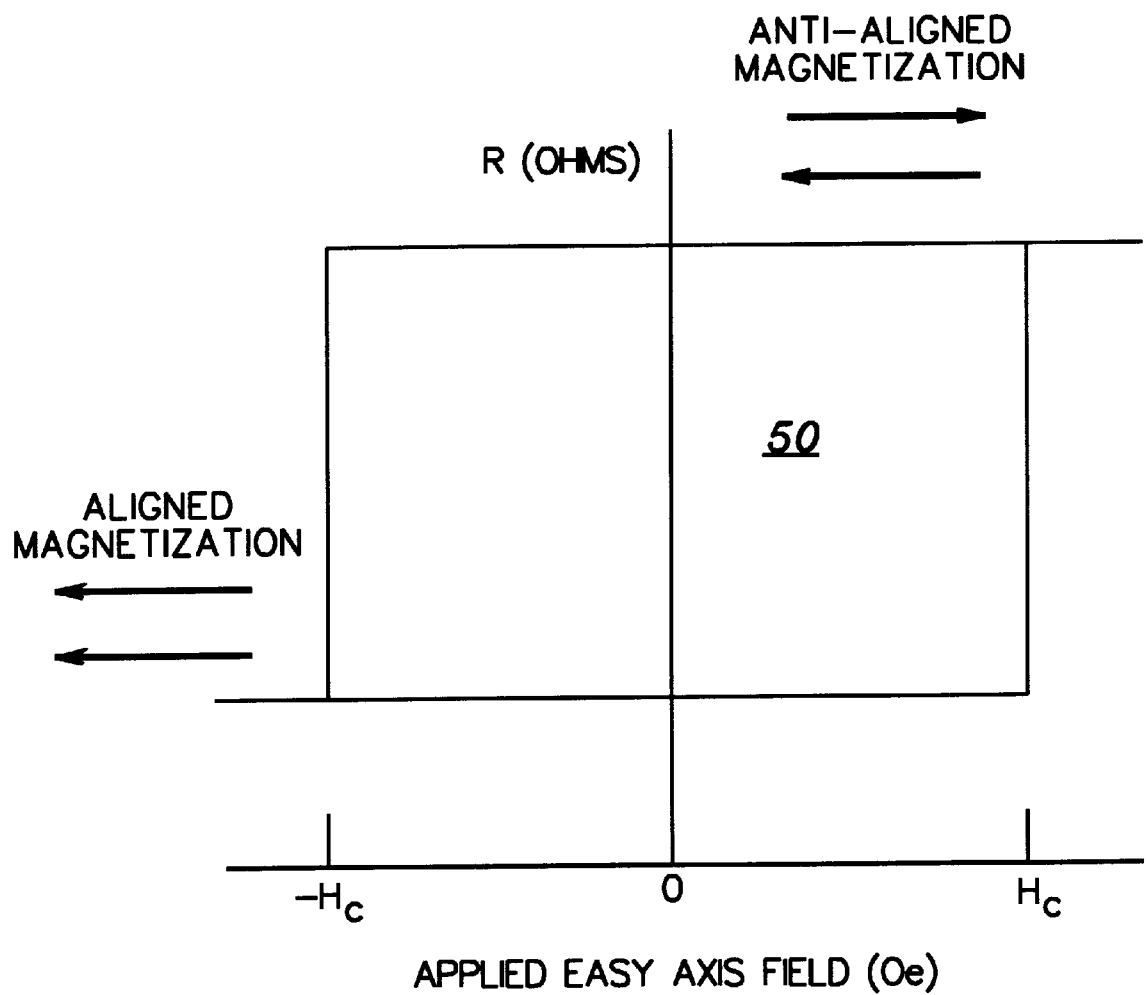
FIG. 2 is an ideal hysteresis loop of the measured resistance versus applied easy axis field for an ideal magnetic tunnel junction device.
Figure 3:
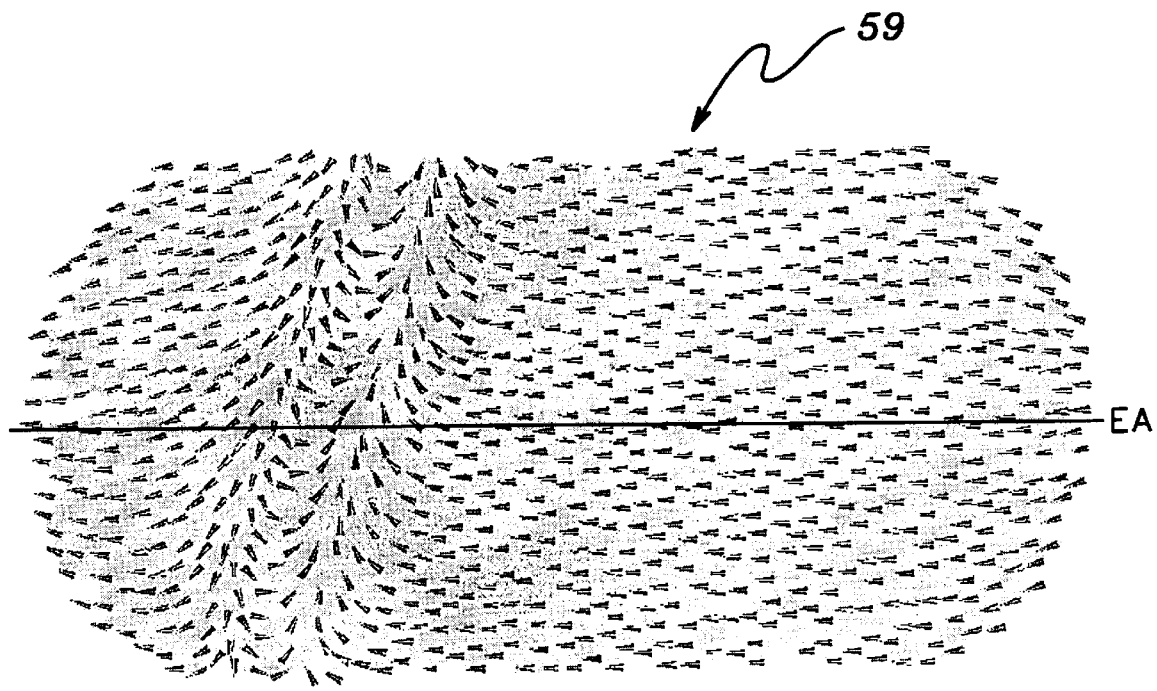
FIG. 3 depicts a magnetization pattern of a sample, symmetrically formed changeable magnetic region, having a complex micromagnetic wall structure therein.
Figure 4:
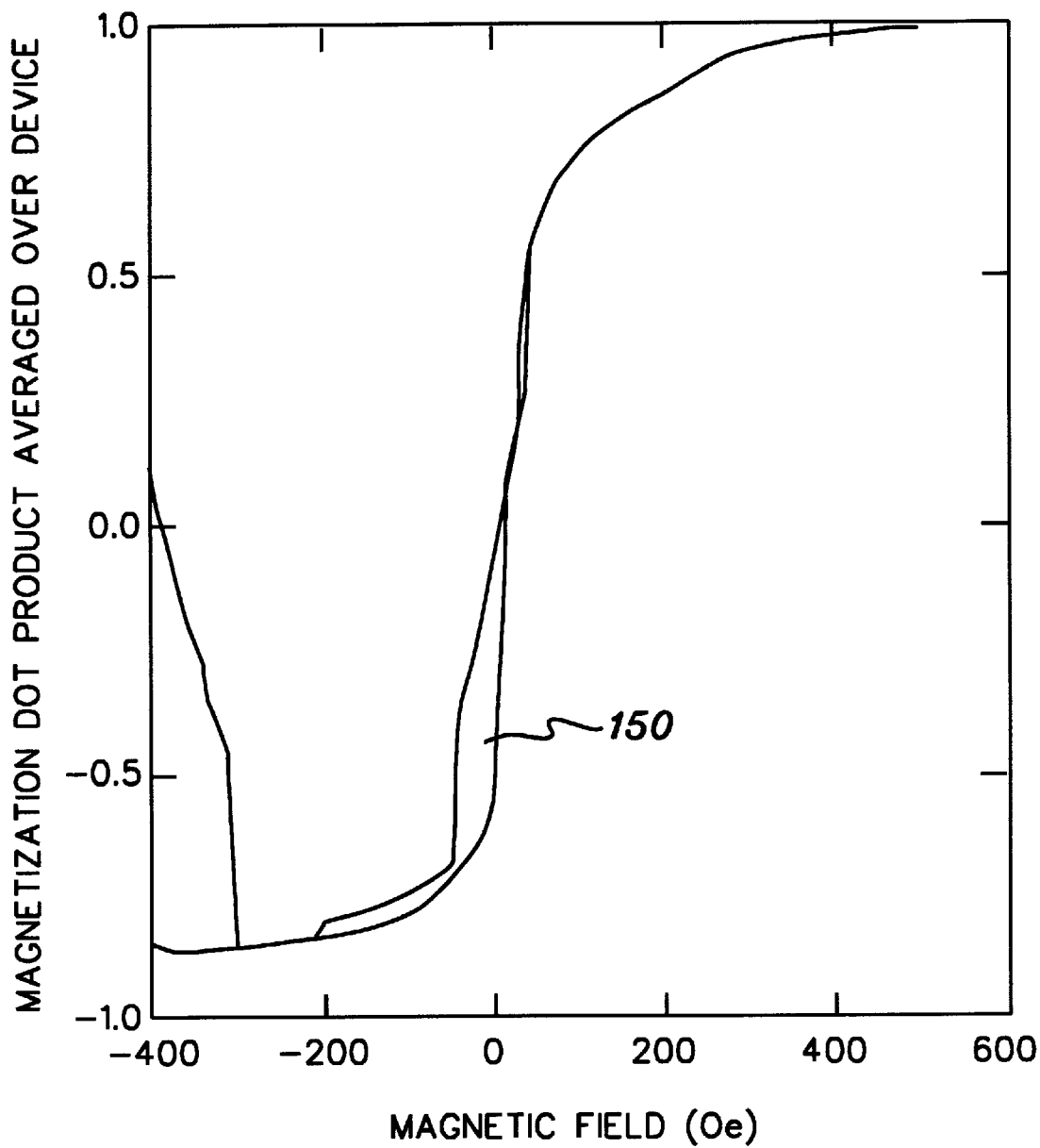
FIG. 4 is a calculated hysteresis loop of the sample region of FIG. 3.

The principles of the present invention regarding the use and formation of magnetic devices in which the magnetic writing stimulus is applied only to a preferred portion of a changeable magnetic region are discussed below with reference to FIGS. 5–8. However, by way of background, the general principles underlying the formation and operation of the magnetic memory array depicted in FIGS. 1a–b are first briefly discussed, in accordance with the above-incorporated U.S. Pat. Nos. 5,640,343 and 5,650,958.

With reference to FIG. 1a, an exemplary MRAM array includes a set of electrically conductive lines that function as parallel word lines 1, 2, and 3 in a horizontal plane, and a set of electrically conductive lines that function as parallel bit lines 4, 5, and 6 in another horizontal plane. The bit lines are oriented in a different direction, e.g., at right angles to the word lines, so that the two sets of lines intersect when viewed from above. A memory cell, such as typical memory cell 9 shown in detail in FIG. 1b, is located at each crossing point of the word lines and bit lines in the intersection region vertically spaced between the lines. Three word lines and three bit lines are illustrated in FIG. 1a, but the number of lines would typically be much larger. The memory cell 9 is arranged in a vertical stack and may include a diode 7 and a magnetic tunnel junction ("MTJ") 8. During operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1a, the array may be formed on a substrate, such as a silicon substrate on which there would be other circuitry. Also, a layer of insulating material is usually located between the bit lines and word lines at regions of the MRAM other than the intersecting regions.

The structure of the memory cell 9 is described in more detail with reference to FIG. 1b. The memory cell 9 is formed on and in contact with a word line 3 (FIG. 1a). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a tungsten stud 12. The diode's n-type silicon layer 10 is connected to word line 3.

The MTJ 8 may be formed of a series of layers of material stacked one on top of the other. The MTJ 8 of FIG. 1bcomprises a template layer 15, such as Pt, an initial ferromagnetic layer 16, such as permalloy (Ni—Fe), an antiferromagnetic layer (AF) 18, such as Mn—Fe, a fixed or "pinned" type of reference ferromagnetic layer (FMF) 20, such as Co, Fe or permalloy, a thin tunneling barrier layer 22 of alumina ($Al_2O_3$), a soft, changeable "free" ferromagnetic layer (FMS) 24, such as a sandwich of thin Co—Fe with permalloy, and a contact layer 25, such as Pt.

The free layer is fabricated to have a preferred axis for the direction of magnetization called the easy axis ("EA"). There are two possible directions of magnetization of the free layer along this easy axis which define the two states of the memory cell. In contrast, the reference layer may be fabricated to have only one preferred direction of magnetization, called its unidirectional anisotropy direction, and this direction is parallel to the easy axis of the free layer. The desired easy axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1b). The magnetic moment of the free layer prefers to align along the direction of L.

The unidirectional anisotropy direction of the reference layer is set by growing the Fe—Mn AF layer 18 on the initial ferromagnetic layer 16, which is itself grown on the template layer 15, such as Pt or Cu or Ta. The template layer 15 induces a 111 crystallographic texture in the initial ferromagnetic layer 16. These layers are deposited in a magnetic field directed parallel to the desired easy axis of the free layer, creating the desired intrinsic unidirectional anisotropy direction of the reference layer. Alternatively, the AF layer can be deposited on the template layer in a sufficiently large magnetic field parallel to the said easy axis while heating the substrate to a temperature higher than the blocking temperature of the AF material. In this alternative, the initial ferromagnetic layer 16 is not required. It is also possible to take advantage of the magnetostriction of the fixed layer to develop, during processing, a magnetic anisotropy which aligns magnetization along the applied magnetic field direction during deposition.

Because of exchange coupling between the reference and AF layers, the magnetization direction of the reference layer is more difficult to change than that of the free layer. In the range of fields applied by currents through the bit and word lines, the magnetization direction of the reference layer is fixed or pinned, in this embodiment. Shape anisotropy of the reference layer, which follows the shape anisotropy of the MTJ, provides additional stability of the magnetization direction of the fixed layer. The magnetic fields applied to write the memory cell are large enough to reverse the direction of magnetization of the free layer, but not the direction of the reference layer. Thus, the magnetization of the fixed layer does not change direction during operation of the memory cells in the MRAM.

During array operation, when a sufficiently large current is passed through both a write line and a bit line of the MRAM, the self-field of the combined current at the intersection of the write and bit lines will rotate the magnetization of the free layer of the single particular MTJ located at the intersection of the energized write and bit lines. The current levels are designed so that the combined self-field exceeds the switching field of the free layer. This self-field is designed to be much smaller than the field required to rotate the magnetization of the reference layer. The cell array architecture is designed so that the write currents do not pass through the MTJ itself. The memory cell is read by passing a sense current perpendicularly through the diode and MTJ from the reference layer through the tunnel junction barrier to the free layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing Al$_2$O$_3$ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free and the reference layers. The tunneling current is spin polarized, which means that the electrical current passing from one of the ferromagnetic layers, for example, the fixed layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second it ferromagnetic layer. Usually, when the magnetic moment of the second ferromagnetic layer is aligned to the magnetic moment of the first ferromagnetic layer, there are more available electronic states than when the magnetic moment of the second ferromagnetic layer is aligned anti-aligned to that of the first ferromagnetic layer. Thus, the tunneling probability of the charge carriers is highest when the magnetic moments of both layers are aligned, and is lowest when the magnetic moments are anti-aligned. When the moments are arranged, neither aligned nor anti-aligned, the tunneling probability takes an intermediate value. Thus, the electrical resistance of the cell depends on both the spin polarization of the electrical current and the electronic states in both of the ferromagnetic layers. As a result, the two possible magnetization directions of the free layer uniquely define two possible bit states (0 or 1) of the memory cell.

Figure 5:
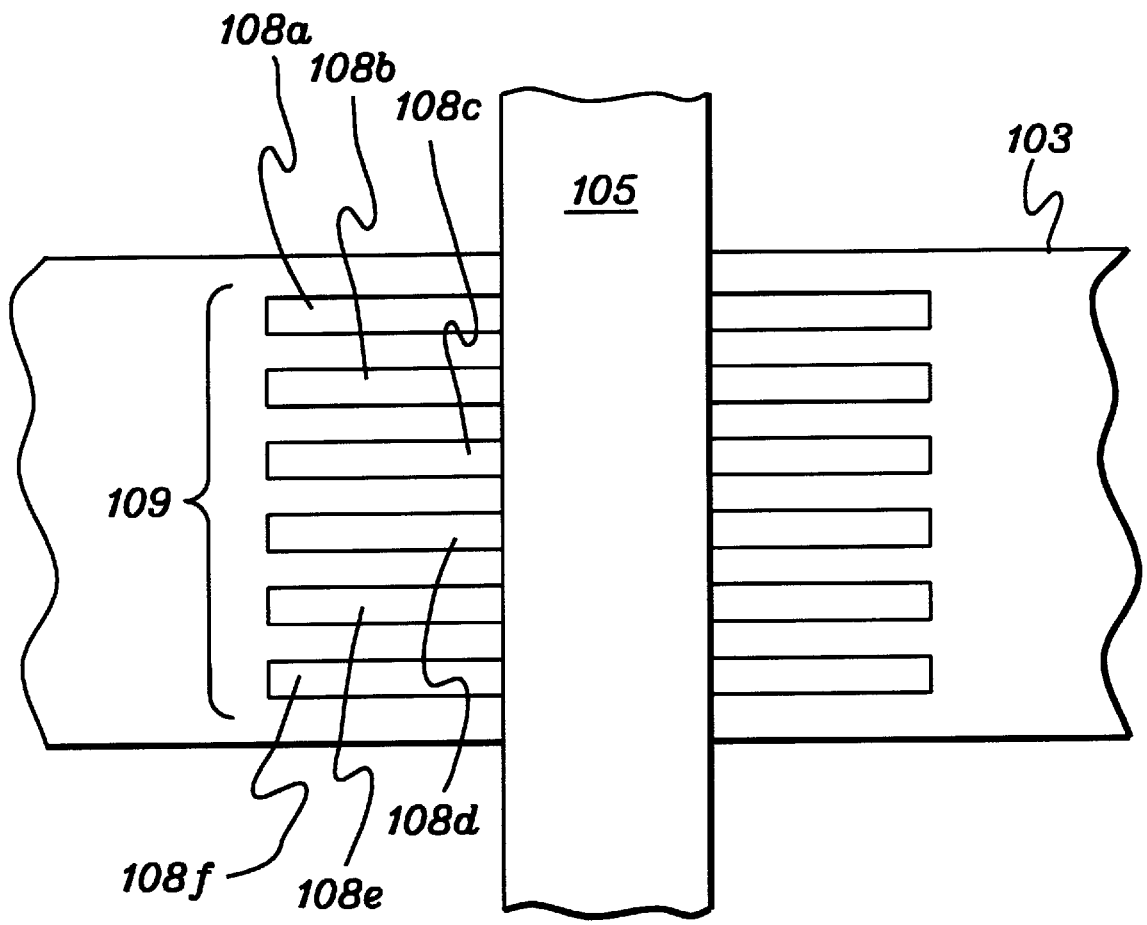
FIG. 5 depicts a first embodiment of the present invention in which one (or more) elongated changeable magnetic regions is provided in a single device, wherein magnetic writing stimuli is applied only to preferred, central portion (s) of the changeable magnetic region(s)

In accordance with the present invention, and with reference to FIG. 5, a magnetic device 109 comprises one or more (108a–f) changeable or free magnetic regions which are substantially longer than the intersecting region formed by the underlying wordline 103, and the crossing bitline 105 (together an exemplary form of a stimuli applying structure). By arranging the changeable magnetic region(s) such that only a preferred portion thereof intersect(s) with the intersecting region formed by the wordline 103 and bitline 105, only a preferred portion of the changeable region(s) is stimulated during a write cycle by the bitline and wordline. By restricting the magnetic stimuli to only the preferred (e.g., central) portion of the exemplary elongated changeable magnetic region(s) depicted, the magnetization patterns in the preferred (e.g., central) portion(s) will dependably and uniformly assume one of the two opposing directions of magnetization, and any potentially undesirable magnetization patterns towards the ends of the changeable regions 108 are not used or eliminated entirely, and therefore do not affect the subsequent writing performance of the device. Devices with large aspect ratios, e.g., free regions of a few tenths of microns in width, and length on the order of 1 micron, are desirable for device stability.

The changeable magnetic region(s) should be sufficiently long to ensure that the central, preferred portion(s) thereof will initiate the reversal of magnetization when the wordline/bitline combination is energized. Because this is likely the most perfect lithographically defined region, and because of the likelihood that no adverse walls or other micromagnetic structures exist in this region, the reversal process should be highly repeatable for a given device, and from device to device.

Changing the device between its two opposing directions of magnetization can be effected by applying a hard axis field on the wordline, followed by a pulsed field on the bitline. By rotating the magnetization upwards, a pair of walls are formed which sweep towards the junction ends. As the walls sweep towards the ends of the changeable region, they annihilate, and minimized "winding up" of multiple walls is therefore expected. Estimates of the switching time for this type of device indicate completion of the entire process in a few nanoseconds.

Though six separate free or changeable regions 108a–f (and therefore six separate tunnel junctions) are depicted in FIG. 5, those skilled in the art will recognize that the present invention extends to a single changeable region, or any number of changeable regions, which form a magnetic device. As discussed in the above-identified, co-filed U.S. Patent Application entitled "MAGNETIC MEMORY DEVICES HAVING MULTIPLE MAGNETIC TUNNEL JUNCTIONS THEREIN," certain advantages can be obtained by the use of multiple magnetic tunnel junctions in each device. These advantages include the predictability of response across an entire array of such devices. Multiple changeable regions are changeable substantially together into a given state using this approach, i.e., they may not all change, but their overall, average state provides predictability of response across the array.

FIGS. 6a–b depict the two, respective opposing directions of magnetization in an exemplary changeable magnetic region 108a, respectively. The easy axis ("EA") lies along the elongated axis of these regions, and as shown, the exemplary central, preferred portion of this region uniformly assumes one of the two opposing states of magnetization.

Also shown in FIGS. 6a–b are the possible magnetization patterns present at each end of the elongated changeable region 108a. Despite the opposing directions of magnetization present at the central portions of the region, both ends of the region may have a common (e.g., vertical) direction of magnetization which remains independent of the direction of magnetization in the central portion thereof. In accordance with the principles of the present invention, the ends of the elongated magnetic regions can be intentionally biased to enforce this alignment of the magnetization in this direction orthogonal to the easy axis. This effect can be achieved simply by setting the reference region of the magnetic tunnel junction at an angle to the easy axis, so that coupling to the changeable region induces a preferred orthogonal direction. A similar effect can be achieved by using fixed magnetization sources deposited nearby. This technique is shown in FIGS. 6a–b in which exemplary hard magnets 160a–d or 162a–b are placed at the ends of the elongated regions to maintain this common magnetization direction. Exchange coupling to an anti-ferromagnetic layer can also be used. The advantage obtained from such biasing arrangements is that the reversal of the central, preferred portion of the changeable magnetic region can be accomplished without any "winding up" or adverse magnetization patterns towards the ends of the region.

The principles of the present invention can be used alone, or in combination with others disclosed in the above-identified, co-filed U.S. Patent Applications. For example, by restricting the magnetoresistive electrical interaction to a preferred portion of the changeable magnetic region, e.g., under the bitline and/or wordline, improved hysteresis loops can be achieved. Limiting interaction to a preferred region can be accomplished in accordance with the principles of the above-incorporated U.S. Patent Application entitled, "LIMITING MAGNETORESISTIVE ELECTRICAL INTERACTION TO A PREFERRED PORTION OF A CHANGEABLE MAGNETIC REGION IN MAGNETIC DEVICES," including masking of the tunneling area prior to deposition of aluminum oxide, or by implantation of oxygen molecules into a partially oxidized aluminum barrier.

In addition, using asymmetry and/or arrays of multiple junctions (e.g., arranged in parallel) can reduce the manufacturing variability, and allow for engineering of the switching fields, in accordance with the asymmetric cell arrangement and stimulus approaches disclosed in the above-incorporated U.S. Patent Applications entitled "MAGNETIC MEMORY DEVICES HAVING MULTIPLE MAGNETIC TUNNEL JUNCTIONS THEREIN" and "INTENTIONAL ASYMMETRY IMPOSED DURING FABRICATION AND/OR ACCESS OF MAGNETIC TUNNEL JUNCTION DEVICES."

Further, in order to further adjust the required reversal field, either or both of the reference and changeable magnetic layers can comprise anti-parallel structures in which two magnetic layers are strongly anti-ferromagnetically coupled by a thin metallic layer. Such anti-parallel pinning can also reduce the aspect ratio required to achieve stable magnetic states.

Figure 7:
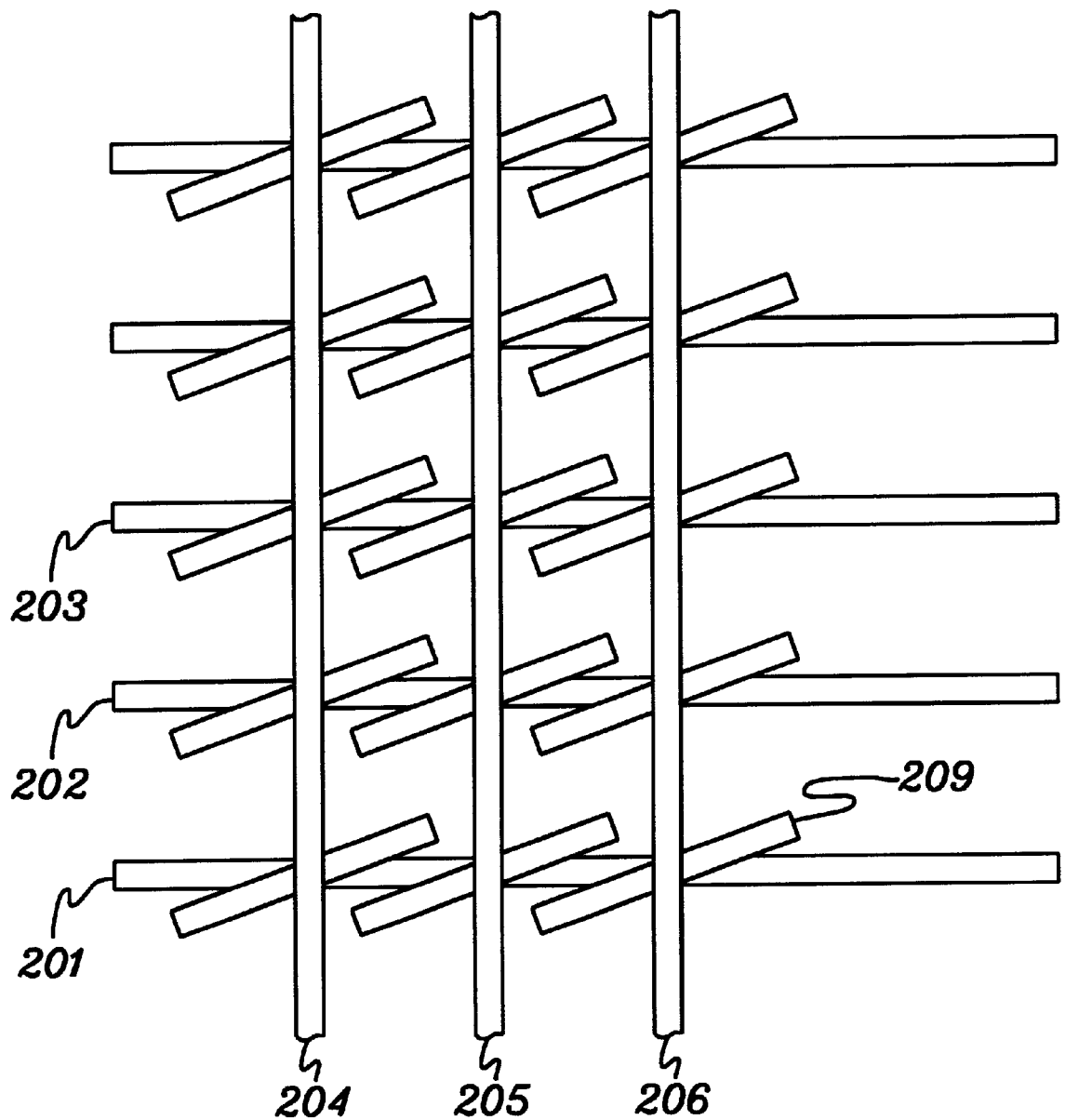
FIG. 7 depicts a magnetic memory array having elongated changeable magnetic regions at the intersections of bitlines and wordlines, wherein the changeable magnetic regions are non-parallel to the bitlines and wordlines, and are interdigitated to improve memory array density.

Although the elongated junction aspect ratio may adversely impact memory array density, it is possible to interdigitate the junctions to obtain a greater packing density. Such an arrangement is depicted in FIG. 7, in which wordlines 201–203 and bitlines 204–206 are shown forming a plurality of intersecting regions at which tunnel junction devices are placed to form a magnetic memory array. Each individual cell (e.g., cell 209) can be oriented at an angle with respect to its respective crossing bitline and wordline so that some overlap in a plane parallel to the planes in which the bitlines and wordlines are arranged is obtained. Alternatively, the bit or wordlines can be formed into a zig-zag pattern to both increase density while maintaining local orthogonality of all devices. (The "crossing lines" of the present invention need not cross perpendicular, i.e., they could cross at any angle, e.g., 45°.)

The density of the pattern of cells in a memory array depends on the length of the changeable magnetic region(s) in the easy axis direction. This length in turn depends on the range of field that the lines apply to the junction. In general, the changeable magnetic region needs to be of order three times the width of the bitline or longer. Therefore, to maintain device density, it may be desirable to use a minimized bitline width that can still produce the required switching field.

Figure 8:
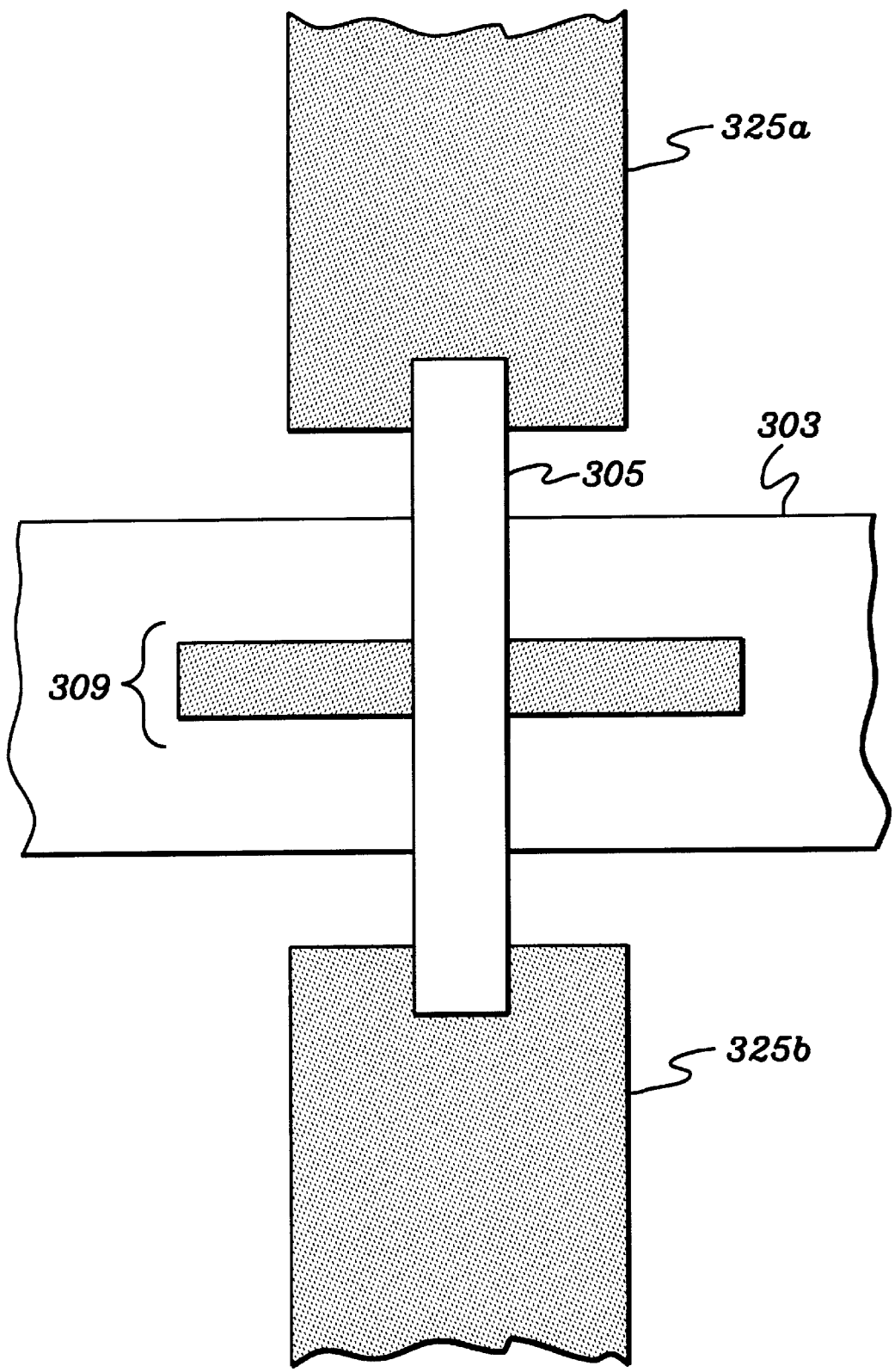
FIG. 8 depicts an alternate embodiment of the present invention wherein a bitline is narrowed near an intersection with a wordline such that magnetic writing stimuli is only provided to a preferred portion of a changeable magnetic region of the device at the bit/wordline intersection.

One possible approach to minimizing bitline width is shown in FIG. 8, in which magnetic device 309 is disposed between wordline 303 and bitline portion 305. Bitline portion 305 is "thinned down" from bitline portions 325a–b using a hybrid e-beam/optical lithography approach. This geometry would have the advantage of shrinking device size, while not requiring full e-beam exposure.

Known methods for fabricating the regular grating-like structure that defines the junctions in a given cell can be used to make the magnetic regions therein quite small with respect to the wiring lithography length scale. As an example, a one-dimensional grating of magnetic regions can be made using two interfering beams to expose photoresist, followed by a second photoresist step using conventional exposure to define the junction area in each cell. Additional fabrication methods are available, such as those disclosed in the above-incorporated U.S. Patents and co-filed Applications.

Though only the changeable magnetic regions are depicted in FIGS. 5–8 for clarity, those skilled in the art will recognize that some or all of the other facilitating structures depicted in FIGS. 1a–b will be present. Separate tunneling and reference magnetic regions can be provided for each separate changeable magnetic region, or single cohesive tunneling and fixed layers can be used to support multiple changeable regions. Such structures are discussed in the above-incorporated U.S. Patent Application entitled "MAGNETIC MEMORY DEVICES HAVING MULTIPLE MAGNETIC TUNNEL JUNCTIONS THEREIN."

Although the invention herein was disclosed primarily in connection with magnetic tunnel junction devices in an MRAM, the improvements herein are applicable to magnetic devices in general in which a changeable magnetic region may require writing using a stimulus applying structure, including logic devices, etc.

While the invention has been particularly shown and described with reference to preferred embodiment(s) thereof, it will be understood by those skilled in the art that various changes in form and details may be made therein without departing from the spirit and scope of the invention.

What is claimed is:

1. A magnetic device, comprising:
   a first magnetic region changeable into each of two magnetic states according to magnetic stimuli applied thereto; and
   a stimuli applying structure arranged with respect to said first magnetic region to apply said magnetic stimuli only to a preferred portion, less than a whole, of said first magnetic region.

2. The magnetic device of claim 1, further comprising:
   a plurality of first magnetic regions, including said first magnetic region, changeable substantially together into said each of two magnetic states according to said magnetic stimuli applied thereto;
   wherein said stimuli applying structure is arranged with respect to said plurality of first magnetic regions to apply said magnetic stimuli only to respective preferred portions of said plurality of first magnetic regions.

3. The magnetic device of claim 2, wherein said plurality of first magnetic regions is arranged such that magnetic patterns in respective first magnetic regions change substantially together into said each of two magnetic states upon the application of said magnetic stimuli.

4. The magnetic device of claim 3, wherein at least some of said plurality of first magnetic regions are elongated and arranged parallel to one another along elongated axes thereof.

5. The magnetic device of claim 2, wherein said stimuli applying structure comprises a first line and a crossing second line, a portion of at least one of said lines having a smaller lateral dimension than the elongated dimension of said plurality of first magnetic regions, said portion of said at least one of said lines crossing said plurality of first magnetic regions proximate the respective preferred portions thereof to apply said magnetic stimuli only to said respective preferred portions.

6. The magnetic device of claim 5, in combination with a magnetic memory, the magnetic device comprising a magnetic memory cell in said magnetic memory, the magnetic memory comprising:

first and second pluralities of crossing lines, including said first and second lines respectively, forming a plurality of intersecting regions; and a plurality of magnetic memory cells, including said magnetic memory cell, each disposed at a respective one of the plurality of intersecting regions and being accessed by the respective crossing lines forming its respective intersecting region.

7. The magnetic device of claim 1, wherein said first magnetic region is elongated.

8. The magnetic device of claim 7, wherein said stimuli applying structure comprises a first line and a crossing second line, at least one of said lines having a smaller lateral dimension than the elongated dimension of said first magnetic region and crossing said first magnetic region proximate the preferred portion thereof to apply said magnetic stimuli only to said preferred portion.

9. The magnetic device of claim 8, in combination with a magnetic memory, the magnetic device comprising a magnetic memory cell in said magnetic memory, the magnetic memory comprising:

first and second pluralities of crossing lines, including said first and second lines respectively, forming a plurality of intersecting regions; and a plurality of magnetic memory cells, including said magnetic memory cell, each disposed at a respective one of the plurality of intersecting regions and being accessed by the respective crossing lines forming the respective intersecting region.

10. The magnetic device of claim 8, wherein said first and second lines cross perpendicularly to form an intersecting region therebetween, and wherein said first magnetic region crosses through said intersecting region non-parallel to either to said first or second line.

11. The magnetic device of claim 10, in combination with a magnetic memory, the magnetic device comprising a magnetic memory cell in said magnetic memory, the magnetic memory comprising:

first and second pluralities of crossing lines, including said first and second lines respectively, forming a plurality of intersecting regions; and a plurality of magnetic memory cells, including said magnetic memory cell, each disposed at a respective one of the plurality of intersecting regions and being accessed by the respective crossing lines forming the respective intersecting region;

wherein each of said first magnetic regions of said plurality of magnetic memory cells crosses through its respective intersecting region non-parallel to either of the respective crossing lines forming its respective intersecting region.

12. The combination of claim 11, wherein the first magnetic regions are interdigitated across said magnetic memory in a plane parallel to planes in which the first and second pluralities of crossing lines are formed thereby improving memory density.

13. The magnetic device of claim 1, wherein said first magnetic region is elongated, and wherein the at least two magnetic states comprise substantially opposing directions of magnetization along a central portion of the elongated axis of said first magnetic region, the two substantially opposing directions of magnetization evolving into a common direction of magnetization at each of the respective ends of said elongated first magnetic region.

14. The magnetic device of claim 13, wherein the elongated first magnetic region is formed to maintain said common direction of magnetization at the respective ends thereof while allowing the first magnetic region to assume either of the two substantially opposing directions of magnetization in the central portion thereof.

15. The magnetic device of claim 14, further comprising:

at least one fixed magnetization source, disposed at a respective end of said elongated first magnetic region, to maintain said common direction of magnetization at the respective end of said elongated first magnetic region, while allowing the first magnetic region to assume either of the two substantially opposing directions of magnetization in the central portion thereof.

16. The magnetic device of claim 13, wherein the common direction of magnetization is orthogonal to both the first and second directions of magnetization.

17. A method for writing one of two magnetic states to a magnetic device having a first magnetic region changeable into each of said two magnetic states, comprising:

applying a magnetic writing stimuli only to a preferred portion, less than a whole, of said first magnetic region.

18. The method of claim 17, wherein said preferred portion of said first magnetic region comprises a region wherein each of the two magnetic states can be dependably predicted to be in directions opposite of one another.

19. The method of claim 18, wherein said first magnetic region is elongated, said preferred portion of said first magnetic region comprises a central portion thereof, and wherein the two opposing directions of magnetization in the central portion of the elongated first magnetic region evolve into a common direction of magnetization at each of the respective ends of said elongated first magnetic region.

20. The method of claim 17, wherein said applying includes using a stimuli applying structure arranged to apply said magnetic writing stimuli only to the preferred portion of said first magnetic region, and not any remaining portion thereof.

21. A method for accessing a magnetic memory cell in a magnetic memory, comprising the method for writing one of two magnetic states to the magnetic device of claim 17, wherein said magnetic device comprises said magnetic memory cell.

22. A method for forming a magnetic device, comprising:

forming a first magnetic region changeable into each of two magnetic states according to magnetic stimuli applied thereto; and forming a stimuli applying structure proximate said first magnetic region such that said magnetic stimuli is applied thereby to only a preferred portion, less than a whole, of the first magnetic region.

23. The method of claim 22, wherein said forming the first magnetic region includes forming the first magnetic region to be elongated and wherein the preferred portion of said first magnetic region comprises a central portion of said elongated first magnetic region.

24. The method of claim 23, wherein said forming the stimuli applying structure includes forming at least one line for applying said magnetic stimuli, the line crossing the first magnetic region and having a smaller lateral dimension than the elongated dimension of the first magnetic region, such that the at least one line applies the magnetic stimuli to only the central, preferred portion of the first magnetic region.

25. The method of claim 22, further comprising:

forming a plurality of magnetic regions changeable into each of the first two magnetic states, including said first magnetic region, the plurality of regions changeable substantially together into each of the two magnetic states.

26. The method of claim 25, wherein said forming the plurality of first magnetic regions includes forming each of the plurality of first magnetic regions to be elongated.

27. The method of claim 22, wherein said forming the stimuli applying structure includes:

forming first and second crossing lines to form an intersecting region; and wherein said forming the first magnetic region includes:
forming the first magnetic region in the intersecting region between the first and second crossing lines.

28. The method of claim 27, wherein said forming the first magnetic region includes forming the first magnetic region to be elongated that its elongated dimension is greater than the lateral dimension of at least one of the first and second crossing lines forming the intersecting region between which the first magnetic region is formed.

29. The method of claim 22, wherein said forming the first magnetic region includes forming the first magnetic region to be elongated, wherein each of the two magnetic states comprises opposing directions of magnetization along a central portion of the elongated axis of said elongated first magnetic region, wherein the opposing directions of magnetization evolve into a common direction of magnetization at each respective end of the elongated first magnetic region.

30. The method of claim 29, further comprising:

intentionally biasing at least one of the respective ends of the elongated first magnetic region to maintain the common direction of magnetization at the at least one respective end thereof, without impacting the ability of the first magnetic region to assume either one of the opposing directions of magnetization in the central portion thereof.

31. The method of claim 30, wherein the step of intentionally biasing includes applying at least one fixed magnetization source at the at least one respective end of the elongated first magnetic region.

* * * * *